(12) United States Patent
Suh et al.

(10) Patent No.: US 7,595,502 B2
(45) Date of Patent: Sep. 29, 2009

(54) METHOD OF MANUFACTURING THIN FILM TRANSISTOR, THIN FILM TRANSISTOR MANUFACTURED BY THE METHOD, AND DISPLAY DEVICE EMPLOYING THE SAME

(75) Inventors: Min-Chul Suh, Suwon-si (KR); Jae-Bon Koo, Suwon-si (KR)

(73) Assignee: Samsung Mobile Display Co., Ltd., Yongin, Gyunggi-Do ( * ) Notice: Subject to any disclaimer, the term of this patent is extended or adjusted under 35 U.S.C. 154(b) by 460 days.

(21) Appl. No.: 11/363,198

(22) Filed: Feb. 28, 2006

(65) Prior Publication Data
US 2006/0197079 A1 Sep. 7, 2006

(30) Foreign Application Priority Data
Mar. 4, 2005 (KR) .................. 10-2005-0018164
Feb. 8, 2006 (KR) .................. 10-2006-0012088

(51) Int. Cl.
*H01L 35/24* (2006.01)
*H01L 51/00* (2006.01)

(52) U.S. Cl. .................. 257/40; 438/99

(58) Field of Classification Search .......... 257/40, 257/59, 72
See application file for complete search history.

(56) References Cited
U.S. PATENT DOCUMENTS
2005/0026317 A1 2/2005 Sirringhaus et al.

2006/0145146 A1* 7/2006 Suh et al. .................. 257/40

FOREIGN PATENT DOCUMENTS

| JP | 2002-359374 | 12/2002 |
|---|---|---|
| JP | 2003-518332 | 6/2003 |
| JP | 2004-515928 | 5/2004 |
| JP | 2004-186393 | 7/2004 |
| KR | 10-2006-0097144 | 9/2006 |
| KR | 10-0659125 | 12/2006 |
| WO | WO 2004/030072 | 4/2004 |

OTHER PUBLICATIONS

European Search Report of the European Patent Application No. 06 11 0603, issued on Jun. 22, 2006.
An article "Polymeric Integrated Circuits and Light-Emitting Diodes" w ritten by De Leeuw, et at., published in Electron Devices Meeting, 1997, Technical Digest, International Washington, DC, pp. 331-332 on Dec. 7, 1997.

* cited by examiner

*Primary Examiner*—Kenneth A Parker
*Assistant Examiner*—Anthony Ho
(74) *Attorney, Agent, or Firm*—Robert E. Bushnell, Esq (57) ABSTRACT

A method of manufacturing a thin film transistor is capable of enhancing pattern precision of an organic semiconductor layer and simplifying a patterning process. The method includes forming an organic insulating film on a substrate and forming a bank having the first and second concave portions and a third concave portion in the organic insulating film, the third concave portion being formed on the first and second concave portions. The method further includes forming a source electrode and a drain electrode in the first and second concave portions and forming an active layer in the third concave portion, the active layer contacting the source electrode and the drain electrode.

10 Claims, 10 Drawing Sheets

METHOD OF MANUFACTURING THIN FILM TRANSISTOR, THIN FILM TRANSISTOR MANUFACTURED BY THE METHOD, AND DISPLAY DEVICE EMPLOYING THE SAME

CLAIM OF PRIORITY

This application makes reference to, incorporates the same herein, and claims all benefits accruing under 35 U.S.C. §119 from applications earlier filed in the Korean Intellectual Property Office on 4 Mar. 2005 and 8 Feb. 2006 and there duly assigned Serial Nos. 10-2005-0018164 and 10-2006-0012088, respectively.

BACKGROUND OF THE INVENTION

1. Field of the Invention

The present invention relates to a thin film transistor, and more particularly to a method of manufacturing a thin film transistor using an organic semiconductor material as an active layer, a thin film transistor manufactured by the method, and a display device employing the same.

2. Description of the Related Art

A display device such as an organic light emitting display and a liquid crystal display which are small in thickness and operate with low voltages, unlike a cathode ray tube (CRT) which is bulky and operates with high voltages, is being widely used as the next generation display device.

Particularly, the organic light emitting display is a self-emitting display device in which electrons and holes injected into organic material through an anode and a cathode are recombined to generate excitons and light with a certain wavelength is emitted by energy of the generated excitons. Accordingly, the organic light emitting display is being highlighted as the next generation display device since it does not require a separate light source such as a backlight, and thus is low in its power consumption, as compared to the liquid crystal display, and in addition, may secure a wide viewing angle and a high response speed easily.

The organic light emitting display, which may be divided into a passive matrix type and an active matrix type depending on a driving method, has mainly employed the active matrix type in recent years owing to its low power consumption, high precision, high response speed, wide viewing angle and small thickness.

In such an active matrix type organic light emitting display, pixels as the basic unit for image representation are arranged in the form of a matrix, and a thin film transistor (TFT) is arranged as a switching element for each of the pixels to be controlled separately.

In recent years, with the wide spread of notebook computers, small portable terminals and so on, a flexible organic light emitting display has been developed, which uses flexible material adapted to such devices, such as plastic, which has little risk of breakage since it is lighter than glass and has flexibility, as substrate material.

It is advantageous for such a flexible organic light emitting display to use an organic TFT (OTFT), as the switching element, using organic semiconductor material, instead of a typical TFT using silicon as an active layer, because the organic semiconductor material allows a low-temperature process and secures flexibility.

Typically, the OTFT has a structure where a gate electrode and an active layer made of organic semiconductor material are formed on a substrate, with a gate insulating film disposed therebetween, and a source electrode and a drain electrode contact the active layer and are isolated from each other in correspondence to either side of the gate electrode.

In addition, the OTFT may be divided into a low molecule OTFT made of such materials as pentacene and a high molecule OTFT made of such as polythiophene depending on the organic semiconductor material composing the active layer.

The organic semiconductor material such as pentacene and polythiophene is difficult and complicated to be patterned since it has poor chemical and optical stability.

In addition, even after being patterned, such organic semiconductor material has difficulty in securing good pattern precision, leading to high possibility of occurrence of particles, which may result in cross-talk with adjacent OTFTs.

SUMMARY OF THE INVENTION

The present invention has been made to overcome the above and other problems, and it is an object of the present invention to provide a method of manufacturing a TFT, which is capable of enhancing pattern precision of an organic semiconductor material and simplifying a patterning process.

It is also an object of the present invention to provide a TFT manufactured by the method of the present invention.

It is further an object of the present invention to provide a display device that employs the TFT of the present invention.

According to one aspect of the present invention, a method of manufacturing a thin film transistor includes forming an organic insulating film on a substrate, forming a bank having first, second and third concave portions in the organic insulating film, the third concave portion being formed on the first and second concave portions, forming a source electrode and a drain electrode in the first and second concave portions, and forming an active layer in the third concave portion, the active layer contacting the source electrode and the drain electrode.

The bank is formed by exposing the organic insulating film using a half tone mask and developing the exposed organic insulating film.

The organic insulating film is made of a negative type photoresist or a positive type photoresist.

The source electrode and the drain electrode are formed by dropping source and drain electrode material in the first and second concave portions using an ink-jet method and curing the substrate on which the source and drain electrode material is dropped.

The source and drain electrode material includes at least one selected from the group including polyethylene dioxythiophene (PEDOT), polyaniline (PANI), conductive high molecules, Ag nano composite, Cu nano composite, Au nano composite, and Pt nano composite, or includes material formed by pattern-coating and firing material containing metal nano particles or carbon nano particles and organic binders, the metal nano particles or the carbon nano particles having a work function value larger than a value resulting from a subtraction of 0.5 eV from a HOMO (Highest Occupied Molecular Orbital) value of material composing the active layer. The metal nano particles includes at least one of Ag nano particles, Cu nano particles, Au nano particles and Pt nano particles.

The active layer is formed by dropping an organic semiconductor material in the third concave portion using an ink-jet method and curing the substrate on which the organic semiconductor material is applied.

The organic semiconductor material include at least one selected from the group including pentacene, tetracene, anthracene, naphthalene, α-6-thiopene, α-4-thiopene, perylene and derivatives thereof, rubrene and derivatives thereof, coronene and derivatives thereof, perylene tetracarboxylic diimide and derivatives thereof, perylene tetracarboxylic dianhydride and derivatives thereof, polyparaperylenevinylene and derivatives thereof, polyfluorene and derivatives thereof, polyparapheylene and derivatives thereof, olygoacene of naphthalene and derivatives thereof, olygoacene of α-5-thiopene and derivatives thereof, pyromellitic dianhydride and derivatives thereof, pyromellitic diimide and derivatives thereof, perylene tetracarboxylic acid dianhydride and derivatives thereof, phthalocyanine and derivatives thereof, naphthalene tetracarboxylic diimide and derivatives thereof, naphthalene tetracarboxylic dianhydride and derivatives thereof, conjugated polymer derivatives containing substituted or non-substituted thiophene, and conjugated polymer derivatives containing substituted fluorine.

The first and second concave portions of the bank have respectively the width of 1 to 50 μm (micrometers or microns) and the height of 50 to 500 nm (nanometers), a distance between the first and second concave portions is 1 to 100 μm, and the third concave portion has the width of 3 to 400 μm and the height of 10 to 1000 nm.

The present invention also contemplates a thin film transistor that includes a gate insulating film, a gate electrode formed on one side of the gate insulating film, an organic insulating film formed on the other side of the gate insulating film, and a source electrode, a drain electrode, and an active layer which are formed to fill in the organic insulating film. The organic insulating film has a bank in which the source electrode, the drain electrode and the active layer are positioned.

The present invention further contemplates a display device that includes a substrate, a thin film transistor formed on the substrate, and a light emitting element connected to the thin film transistor. The thin film transistor includes a gate insulating film, a gate electrode formed on one side of the gate insulating film, an organic insulating film formed on the other side of the gate insulating film, and a source electrode, a drain electrode, and an active layer which are formed to fill in the organic insulating film. The organic insulating film has a bank in which the source electrode, the drain electrode and the active layer are positioned.

The bank includes first and second concave portions in which the source electrode and the drain electrode are positioned, and a third concave portion, in which the active layer is positioned, being formed on the first and second concave portions.

The first and second concave portions of the bank have respectively the width of 1 to 50 μm and the height of 50 to 500 nm, a distance between the first and second concave portions is 1 to 100 μm, and the third concave portion has the width of 3 to 400 μm and the height of 10 to 1000 nm.

The light emitting element has a structure where a first electrode, an organic light emitting layer and a second electrode are stacked in order.

The substrate is made of insulating material such as glass or plastic or metal material such as stainless steel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Hereinafter, preferred embodiments of the present invention will be described in detail with reference to the accompanying drawings.

First, a method of manufacturing a TFT according to the first embodiment of the present invention will be described with reference to FIGS. 1A to 1F and FIG. 2.

Figure 1A:
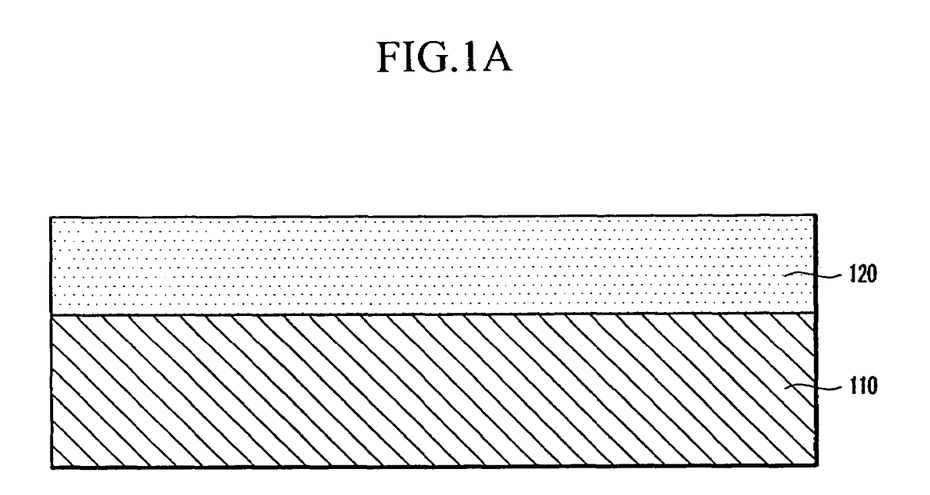
FIGS. 1A to 1F and FIG. 2 are cross sectional views to illustrate a method of manufacturing a TFT according to one embodiment of the present invention.

Referring to FIG. 1A, an organic insulating film 120 is coated on a substrate 110. The substrate 110 can be made of insulating material such as glass or plastic or metal material such as stainless steel (SUS). The plastic can be polyethylene terephthalate (PET), polyethylene naphthalate (PEN), polyether sulfone (PES), polyether imide, polyphenylene sulfide (PPS), polyarylate(PAR), polyimide, polycarbonate (PC), polyacrylate, cellulose triacetate and cellulose acetate propionate (CAP), etc. The organic insulating film 120 can be made of negative type photoresist.

Figure 1B:
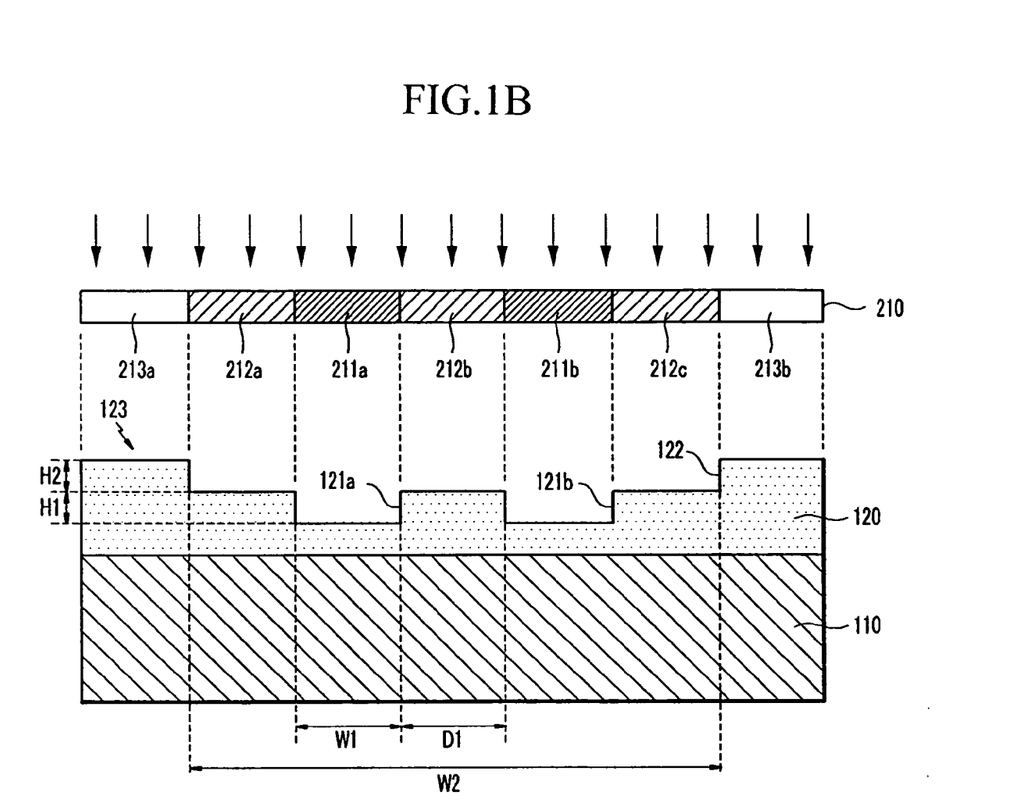

Referring to FIG. 1B, the organic insulating film 120 is exposed using a half tone mask 210 and the exposed organic insulating film 120 is developed, to form a bank 123 having first, second and third concave portions 121a, 121b and 122 in the organic insulating film 120.

The first and second concave portions 121a and 121b are regions in which source and drain electrodes 130a and 130b (refer to FIG. 1D) will be located, respectively and have a rectangular section.

The width W1 of the first and second concave portions 121a and 121b can be 1 to 50 μm so that source and drain electron materials 131a and 131b (refer to FIG. 1C) are not overflowed when flowing them and a high resolution device will be formed.

The height H1 of the first and second concave portions 121a and 121b can be 50 to 500 nm, preferably 200 nm so that the source and drain electron materials 131a and 131b are not overflowed when flowing the source and drain electron materials 131a and 131b and they are uniformly filled in the first and second concave portions 121a and 121b.

The distance D1 between the first and second concave portions 121a and 121b can be 1 to 100 μm as a substantial channel length, because leakage or contact resistance may increase in the channel if the channel length is less than 1 μm and a enough current does not flow through the channel more than 100 μm.

The third concave portion 122 is a region in which an active layer 140 (refer to FIG. 1F) will be located and has a rectangular section.

The width W2 of the third concave portion 122 can be determined according to the width W1 of the first and second concave portions 121a and 121b and the distance D1 therebetween, so that width W2 can be 3 to 400 μm.

The height H2 of the third concave portion 122 can be 10 to 1000 nm so that an organic semiconductor material 141 (refer to FIG. 1E) is not overflowed when flowing the organic semiconductor material 141 and following processes for forming layers can be easily preformed.

The half tone mask 210 can be composed of light-shield regions 211a and 211b for shielding light fully, partial light-transmission regions 212a, 212b and 212c for transmitting some (for example, ½) of light, and light-transmission regions 213a and 213b for transmitting light fully.

As in this embodiment, when the organic insulating film 120 is made of the negative type photoresist, portions not exposed are removed in developing. Accordingly, with the half tone mask 210 arranged such that the light-shield regions 211a and 211b correspond to the first and second concave portions 121a and 121b, the partial light-transmission regions 212a, 212b and 212c correspond to the third concave portion 122 except the first and second concave portions 121a and 121b, and the light-transmission regions 213a and 213b correspond to the portions except the first, second and third concave portions 121a, 121b and 122, the organic insulating film 120 can be exposed.

Figure 3:
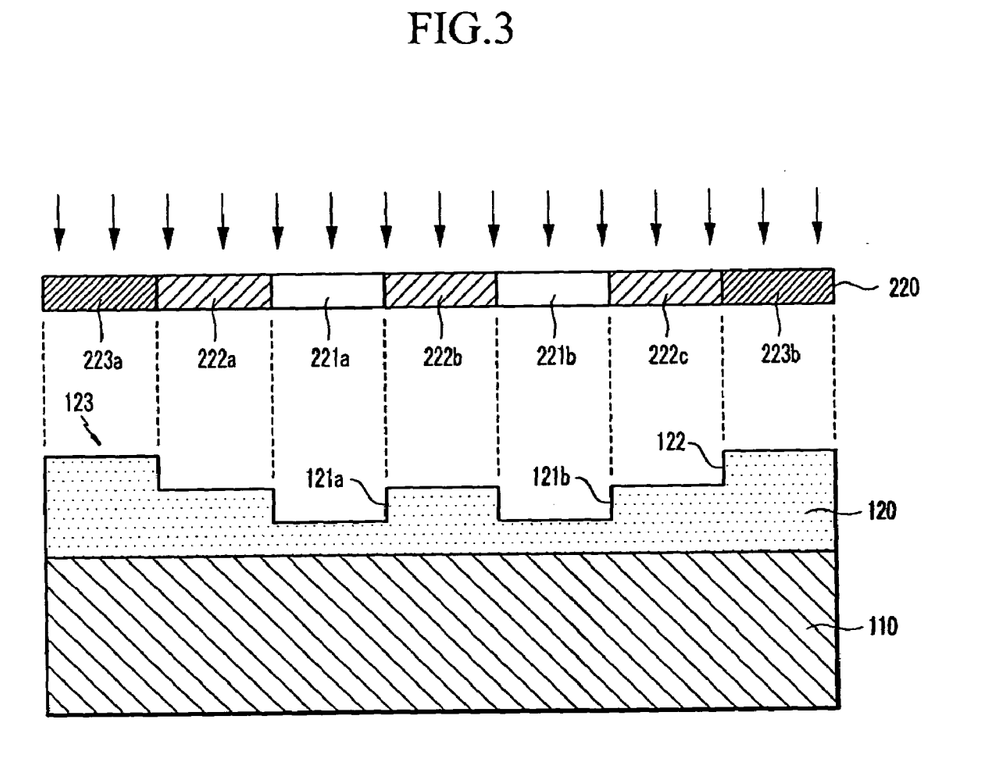
FIG. 3 is a cross sectional view to illustrate a method of manufacturing a TFT according to another embodiment of the present invention.

Alternatively, the organic insulating film 120 can be made of positive type photoresist. In this case, contrary to the above-described embodiment, exposed portions are removed in developing. Accordingly, as shown in FIG. 3, with a half tone mask 220 arranged such that light-transmission regions 221a and 221b correspond to the first and second concave portions 121a and 121b, partial light-transmission regions 222a, 222b and 222c correspond to the third concave portion 122 except the first and second concave portions 121a and 121b, and light-shield regions 223a and 223b correspond to the portions except the first, second and third concave portions 121a, 121b and 122, the organic insulating film 120 may be exposed.

Figure 1C:
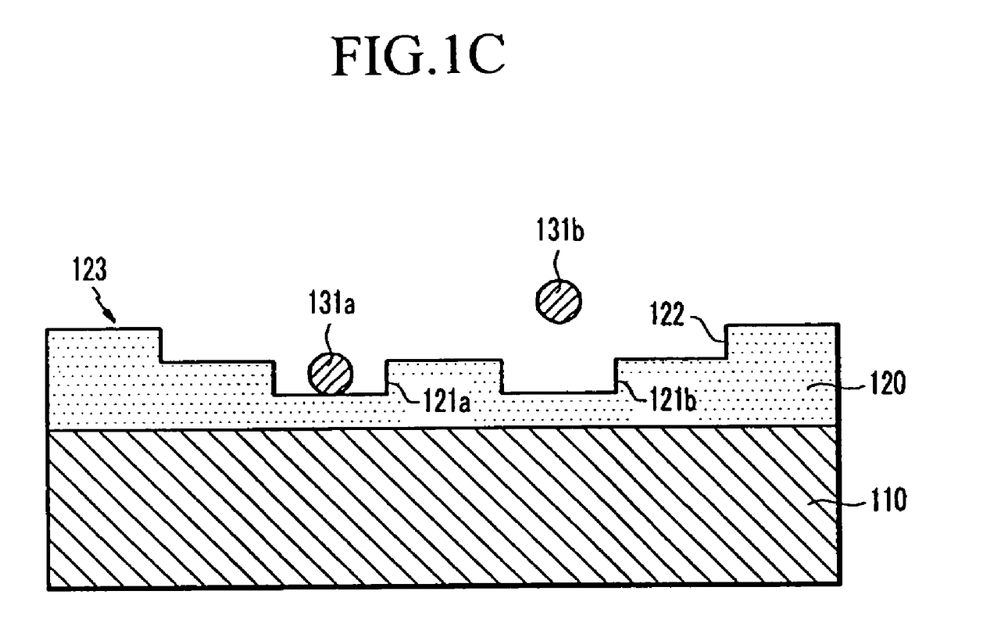

Referring to FIG. 1C, source and drain electrode materials 131a and 131b are dropped on the first and second concave portions 121a and 121b of the bank 123, respectively, using an ink-jet method.

Here, the drop quantity of the source and drain electrode materials 131a and 131b can be approximately $1 \times 10^{-15}$ l. However, this drop quantity is not limitative and may be appropriately adjusted depending on the width and height of the first and second concave portions 121a and 121b.

The source and drain electrode materials 131a and 131b can be made of conductive material such as polyethylene dioxythiophene (PEDOT), polyaniline (PANI), conductive high molecules, metal nano composite, etc. The metal nano composite can be Ag nano composite, Cu nano composite, Au nano composite, Pt nano composite, etc.

Alternatively, the source and drain electrode materials 131a and 131b can be material formed by pattern-coating and curing material containing metal nano particles or carbon nano particles and organic binders. In this case, the metal nano particles may have a work function value larger than a value resulting from a subtraction of 0.5 eV (electron volt) from a HOMO (Highest Occupied Molecular Orbital) value of the organic semiconductor material composing the active layer 140 to be formed later. For example, the metal nano particles can be Ag nano particles, Cu nano particles, Au nano particles, Pt nano particles, etc.

Next, a curing process such as ultraviolet curing and thermal curing is performed to evaporate solvent contained in the source and drain electrode materials 131a and 131b while flowing the source and drain electrode materials 131a and 131b.

At this time, since the source and drain electrode materials 131a and 131b are uniformly flown in the first and second concave 121a and 121b by the bank 123, there does not occur a so-called coffee stain effect that an edge of a pattern becomes thicker than other portions.

Figure 1D:
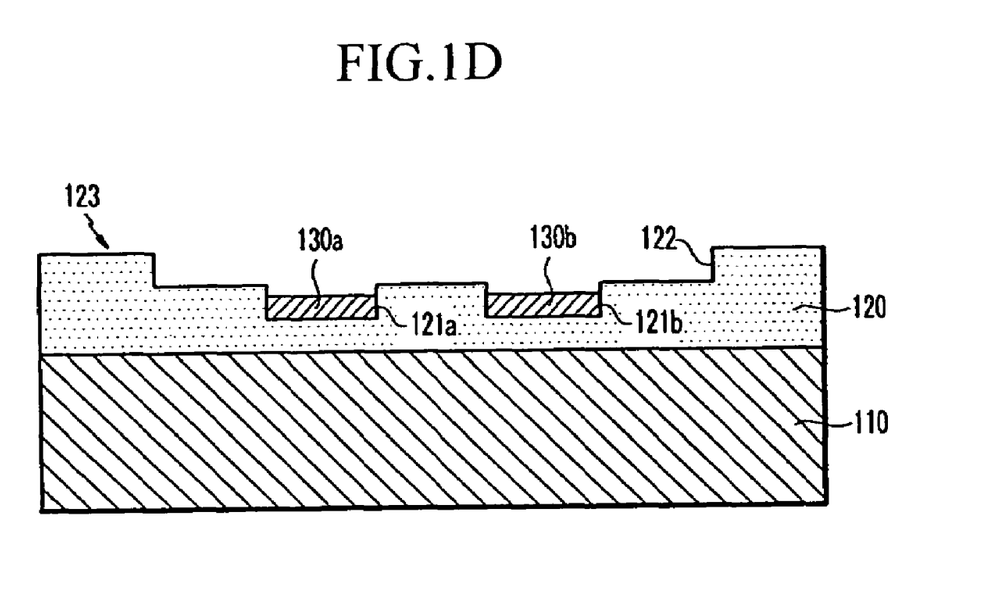

As a result, as shown in FIG. 1D, source and drain electrodes 130a and 130b are formed in such a manner that they fill the first and second concave portions 121a and 121b of the bank 123 in the organic insulating film 120.

Figure 1E:
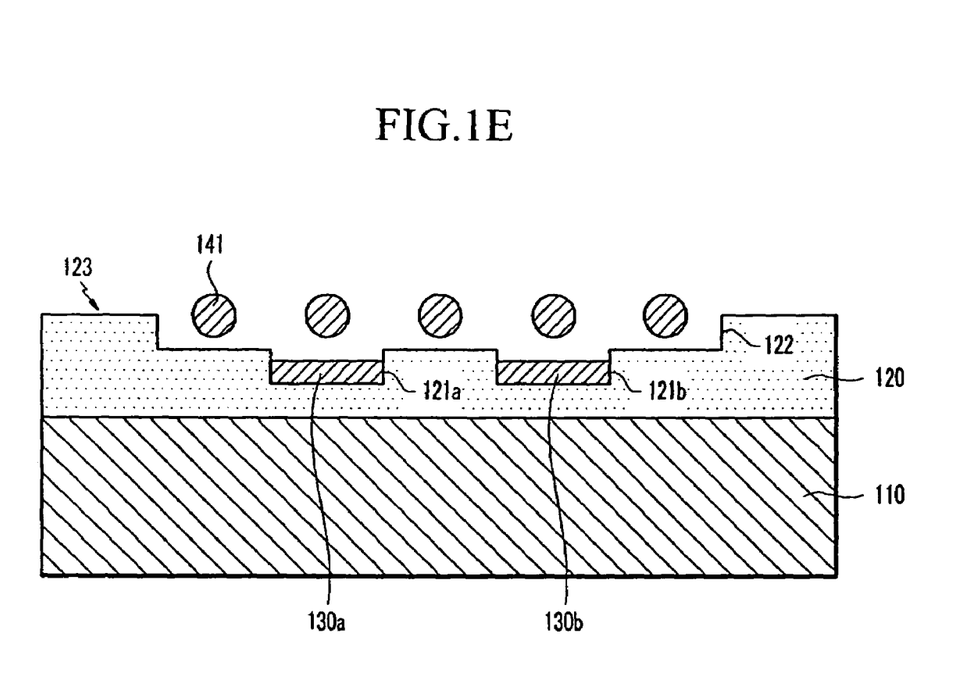

Referring to FIG. 1E, an organic semiconductor material 141 is dropped on the third concave portion 122 using an ink-jet method.

Here, the drop quantity of the organic semiconductor material 141 can be approximately $1 \times 10^{-12}$ l. However, this quantity for application is not limitative and may be appropriately adjusted depending the width and height of the third concave portion 122.

The organic semiconductor material 141 can be pentacene, tetracene, anthracene, naphthalene, α-6-thiopene, α-4-thiopene, perylene and derivatives thereof, rubrene and derivatives thereof, coronene and derivatives thereof, perylene tetracarboxylic diimide and derivatives thereof, perylene tetracarboxylic dianhydride and derivatives thereof, polyparaperylenevinylene and derivatives thereof, polyfluorene and derivatives thereof, polyparapheylene and derivatives thereof, olygoacene of naphthalene and derivatives thereof, olygoacene of α-5-thiopene and derivatives thereof, pyromellitic dianhydride and derivatives thereof, pyromellitic diimide and derivatives thereof, perylene tetracarboxylic acid dianhydride and derivatives thereof, phthalocyanine and derivatives thereof, naphthalene tetracarboxylic diimide and derivatives thereof, naphthalene tetracarboxylic dianhydride and derivatives thereof, conjugated polymer derivatives containing substituted or non-substituted thiophene, conjugated polymer derivatives containing substituted fluorine, etc.

Figure 1F:
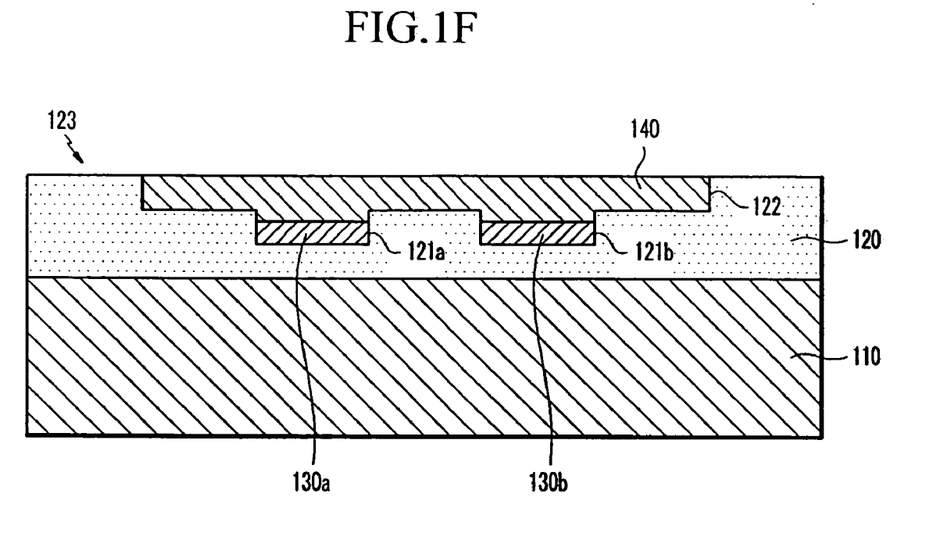

Next, a curing process such as ultraviolet curing and thermal curing is performed to evaporate solvent contained in the organic semiconductor material 141 while flowing the organic semiconductor material 141. Thus, as shown in FIG. 1F, the active layer 140 is formed in such a manner that it fills the third concave portion 122 of the bank 123 while contacting the source and drain electrodes 130a and 130b in the organic insulating film 120.

Figure 2:
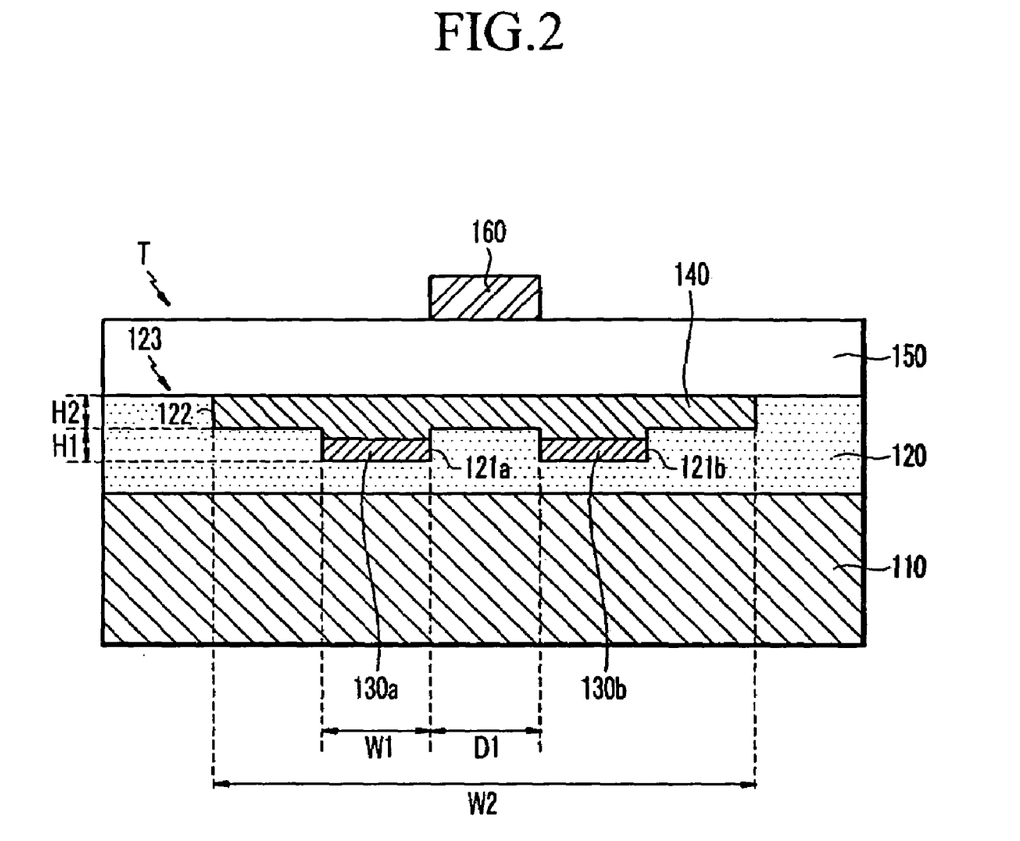

Next, a gate insulating film 150 is formed over the entire surface of the substrate 110, a gate electrode material is deposited on the gate insulating film 150 and is patterned to form a gate electrode 160, thereby forming a TFT "T" having a structure shown in FIG. 2.

The gate insulating film 150 can be made of an organic insulating material such as benzocyclobutene (BCB), polyimide, polyvinyphenol or parylene. The gate electrode material can be Ag, Cu, Au, Pt, Mo, MoW, Al, AlNdCr, Al/Cr, etc.

Thus, in the method of manufacturing the TFT according to this embodiment, the bank 123 is formed in the organic insulating film 120 using the half tone mask 210, the source and drain electrodes 130a and 130b and the active layer 140 are positioned in the bank 123 and are formed in such a manner that they fill in the organic insulating film 120 using the ink-jet method.

Accordingly, a additional patterning process for forming the source and drain electrodes 130a and 130b and the active layer 140 may be excluded to simplify a process of manufacturing the TFT, and moreover, the coffee stain effect may be prevented to attain good pattern precision, thus avoiding cross-talk between TFTs.

While it has been illustrated in this embodiment that the gate electrode 160 is formed over the active layer 140, with the gate insulating film 150 disposed between the gate electrode 160 and the active layer 140, and the source and drain electrodes 130a and 130b contact the bottom side of the active layer 140, the formation position of the gate electrode 160 is not limited to this embodiment.

Figure 4:
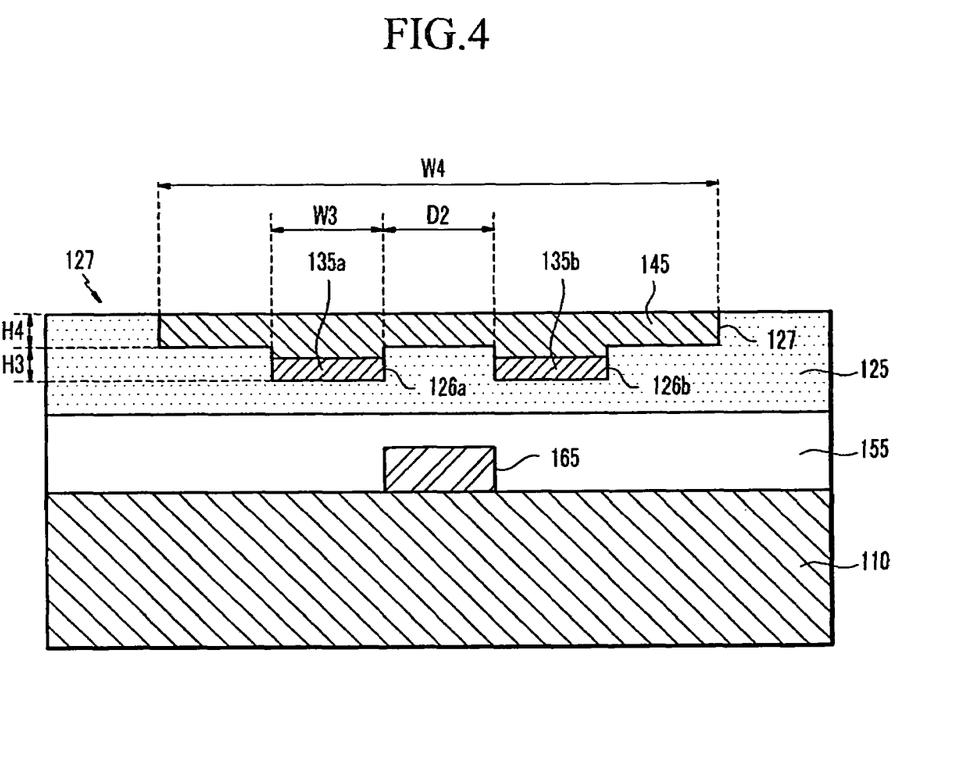
FIG. 4 is a cross sectional view of a TFT according to still another embodiment of the present invention.

For example, as shown in FIG. 4, even a case where a gate electrode 165 is formed below an active layer 145, with a gate insulating film 155 disposed between the gate electrode 165 and the active layer 145, and source and drain electrodes 135a and 135b contact the bottom side of the active layer 145, the source and drain electrodes 135a and 135b and the active layer 145 may be formed in such a manner that they fill in an organic insulating film 125.

Hereinafter, a display device employing the TFT according to the above embodiment of the present invention will be described with reference to FIG. 5. In this embodiment, an organic light emitting display is exemplified as the display device, and the same components as FIG. 2 are denoted by the same reference numerals in FIG. 5, and therefore, detailed explanation thereof will be omitted.

Figure 5:
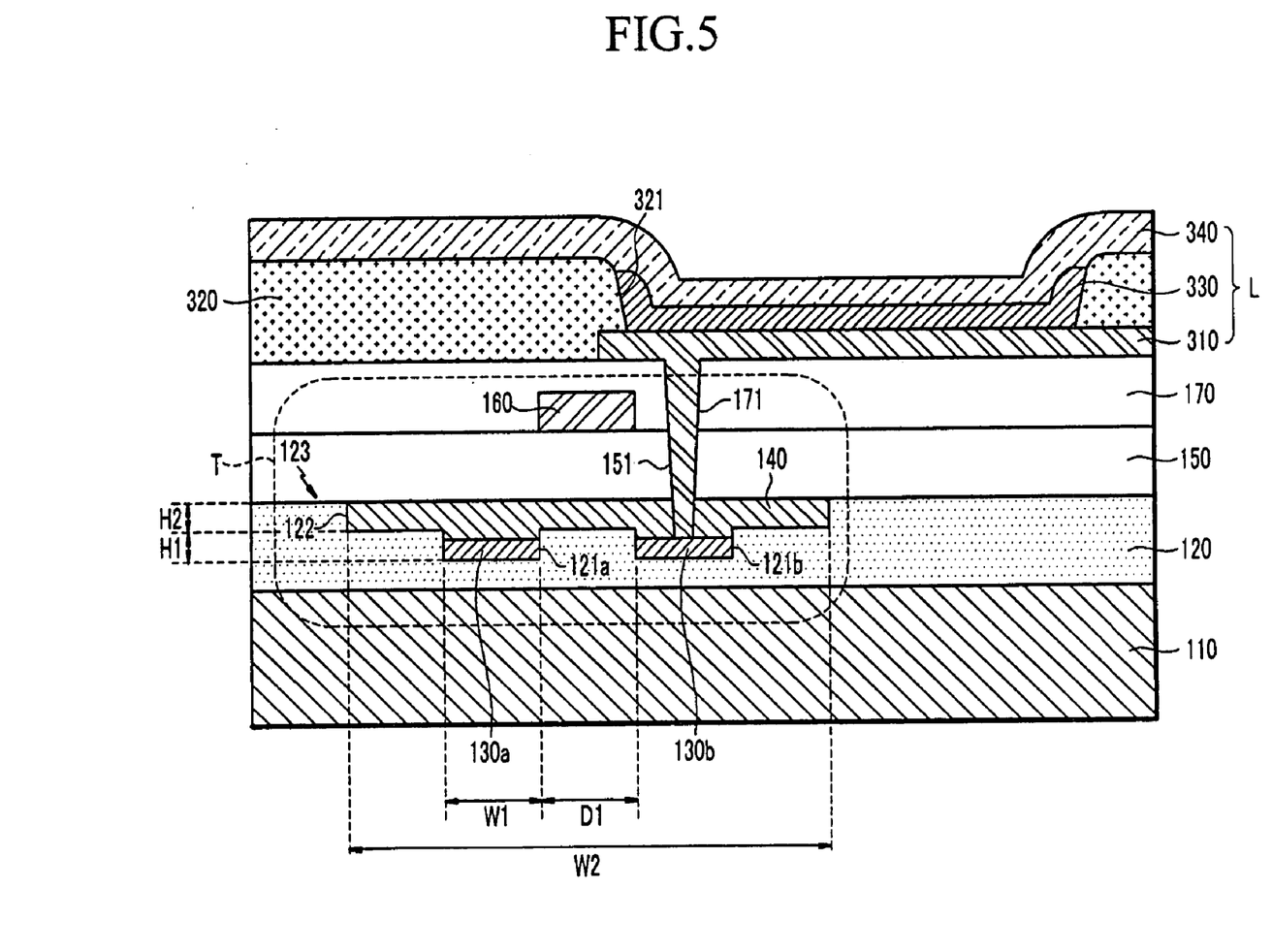
FIG. 5 is a cross sectional view of a display device employing the TFT according to the one embodiment of the present invention.

Referring to FIG. 5, the TFT "T" shown in FIG. 2 is formed as a driving device on the substrate 110, a light emitting element "L" to be connected to a portion of the TFT "T" is formed on the TFT "T", with a planarizing film 170 disposed therebetween, thereby completing pixels.

The substrate 110 can be made of insulating material such as glass or plastic, or metal material such as stainless steel (SUS). The plastic can be polyethylene terephthalate (PET), polyethylene naphthalate (PEN), polyether sulfone (PES), polyether imide, polyphenylene sulfide (PPS), polyarylate, polyimide, polycarbonate (PC), polyacrylate (PAR), cellulose triacetate and cellulose acetate propionate (CAP), etc.

The light emitting element "L" has a structure where a first electrode 310, an organic light emitting layer 330 and a second electrode 340 are stacked in order, and can be connected to a portion of the TFT "T", for example, the drain electrode 130b, via holes 151 and 171 provided in the gate insulating film 150 and the planarizing film 170, respectively. The first electrode 310 is isolated from first electrodes (not shown) of adjacent pixels by a pixel definition layer 320, and contacts the organic light emitting layer 330 via an opening 321 provided in the pixel definition film 320.

The first electrode 310 and the second electrode 340 can be made of one or more of ITO (Indium Tin Oxide), IZO (Indium Zinc Oxide), Al, Mg—Ag, Ca, Ca/Ag and Ba.

The organic light emitting layer 330 can be a low molecule organic material such as copper phthalocyanine (CuPc), N,N'-Di(naphthalene-1-yl)-N,N'-diphenyl-benzidine (NPB), tris-8-hydroxyquinoline aluminum (Alq3), etc., or alternatively, a high molecule organic material.

For example, if the organic light emitting layer 330 is made of the low molecule organic material, it has a multi-layered structure including a hole injection layer (HIL), a hole transport layer (HTL), an emitting layer (EML) and an electron transport layer (ETL).

Alternatively, if the organic light emitting layer 330 is made of the high molecule organic material, it has the hole transport layer (HTL) and the emitting layer (EML). In this case, the HTL is made of PEDOT material and the EML is made of poly-phenylenevinylene (PPV) type or polyfluorene type material.

Although not shown, the pixels are arranged on the substrate 110 in the form of a matrix, composing a display unit, sealed and protected by a seal substrate, on which light emission and display are actually conducted.

While it has been illustrated in this embodiment that the TFT "T" shown in FIG. 2 applied as the driving device of the organic light emitting display, it may be applied as driving devices of other display devices such as a liquid crystal display device and so on.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
   a gate insulating film;
   a gate electrode formed on one side of said gate insulating film;
   an organic insulating film formed on another side of said gate insulating film; and
   a source electrode, a drain electrode, and an active layer which are formed to fill in said organic insulating film;
   the organic insulating film including a bank in which the source electrode, the drain electrode and the active layer are positioned;
   wherein the bank includes first and second concave portions in which said source electrode and said drain electrode are respectively positioned, and a third concave portion in which said active layer is positioned, said third concave portion being formed on said first and second concave portions.

2. The thin film transistor of claim 1, wherein said organic insulating film is made of one of a negative type photoresist and a positive type photoresist.

3. The thin film transistor of claim 1, wherein said active layer is made of an organic semiconductor material.

4. The thin film transistor of claim 1, wherein said first and second concave portions have a width of 1 to 50 μm and a height of 50 to 500 nm;
   wherein a distance between said first and second concave portions is 1 to 100 μm; and
   wherein said third concave portion has a width of 3 to 400 μm and a height of 10 to 1000 nm.

5. A display device, comprising:
   a substrate;
   a thin film transistor formed on said substrate; and
   a light emitting device connected to said thin film transistor,
   said thin film transistor comprising:
      a gate insulating film;
      a gate electrode formed on one side of said gate insulating film;
      an organic insulating film formed on another side of said gate insulating film; and
      a source electrode, a drain electrode, and an active layer which are formed to fill in said organic insulating film;
      said organic insulating film including a bank in which said source electrode, said drain electrode and said active layer are positioned;
   wherein said bank includes first and second concave portions in which said source electrode and said drain electrode are respectively positioned, and a third concave portion in which the active layer is positioned, said third concave portion being formed on said first and second concave portions.

6. The display device of claim 5, wherein said organic insulating film is made of one of a negative type photoresist and a positive type photoresist.

7. The display device of claim 5, wherein the active layer is made of an organic semiconductor material.

8. The display device of claim 5, wherein said first and second concave portions have a width of 1 to 50 μm and a height of 50 to 500 nm;
   wherein a distance between said first and second concave portions is 1 to 100 μm; and
   wherein said third concave portion has a width of 3 to 400 μm and a height of 10 to 1000 nm.

9. The display device of claim 5, wherein said light emitting device has a structure wherein a first electrode, an organic light emitting layer and a second electrode are stacked in order.

10. The display device of claim 5, wherein said substrate comprises insulating material made of any one of glass, plastic, and metal material including stainless steel.

* * * * *